(12) United States Patent
Fernandez-Texon

(10) Patent No.: US 6,545,545 B1
(45) Date of Patent: Apr. 8, 2003

(54) VOLTAGE-CONTROLLED OSCILLATOR FREQUENCY AUTO-CALIBRATING SYSTEM

(75) Inventor: Francisco Fernandez-Texon, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/951,336

(22) Filed: Sep. 10, 2001

(51) Int. Cl.[7] .................................................. H03L 7/26
(52) U.S. Cl. ...................................... 331/1 R; 327/159
(58) Field of Search ........................ 331/DIG. 2, 1 R, 331/17, 1 A; 327/159, 156

(56) References Cited

U.S. PATENT DOCUMENTS 4,272,729 A * 6/1981 Riley, Jr. .................... 331/1 A
5,304,955 A * 4/1994 Atriss et al. ................. 327/159
6,407,642 B2 * 6/2002 Dosho et al. .................. 331/11

* cited by examiner

Primary Examiner—Terry D. Cunningham
Assistant Examiner—Quan Tra
(74) Attorney, Agent, or Firm—MacPherson Kwok Chen & Heid LLP

(57) ABSTRACT

A voltage-controlled oscillator auto-calibrating system is disclosed that performs center-frequency calibration of a VCO. A frequency range detector monitors the VCO frequency and provides coarse adjustments so that the target frequency is within the capture range of the VCO's fine-tuning voltage. A lock detector monitors the phase-locked loop circuit and triggers an adjustment after the phase-locked loop circuit achieves lock. A monotonicity check circuit provides VCO frequency adjustments so that the VCO's fine-tuning frequency range is centered approximately around the target frequency.

18 Claims, 2 Drawing Sheets

VOLTAGE-CONTROLLED OSCILLATOR FREQUENCY AUTO-CALIBRATING SYSTEM

BACKGROUND OF THE INVENTION

1. Field of the Invention

The present invention relates generally to electrical circuits and, more particularly, to voltage-controlled oscillators.

2. Related Art

Frequency synthesizers, such as a multi-rate fractional-N frequency synthesizer, are well known. In a typical frequency synthesizer, a frequency adjustment is required when the maximum or minimum frequency of the voltage-controlled oscillator (VCO) is not sufficient to synthesize the desired frequency. For example, a low-frequency gain VCO should have its center frequency adjusted close to the target value. Otherwise, the limited voltage range of the VCO control voltage is insufficient to compensate for variations in frequency due to such factors as temperature, supply voltage variations, and aging.

A common technique to adjust the center frequency of a VCO on an integrated circuit is to laser trim certain circuit elements, such as a capacitor or a resistor, that control the VCO frequency to adjust the VCO center frequency to within the frequency-capture range. One drawback of physical trimming is that the process is expensive and time consuming because the process must be performed on each integrated circuit. Another drawback is that physical trimming permanently limits the range of frequencies. For example, the target frequency of a programmable frequency synthesizer will vary depending on the application. If the VCO frequency is adjusted by trimming to the center frequency of the frequency range that the synthesizer ID supports, the low-frequency gain VCO will not be capable of varying its frequency to the extent necessary to reach the limits of its frequency-range due to its limited control voltage range. Thus, physical trimming permanently constrains the range of frequencies that can be synthesized to less than what could is possibly be generated by the synthesizer.

BRIEF SUMMARY OF THE INVENTION

A VCO frequency auto-calibrating system is disclosed herein. The VCO frequency auto-calibrating system performs frequency self-calibration of its VCO by use of a VCO frequency range detector, monotonicity check circuit, and a lock detector. The VCO frequency range detector detects when the VCO frequency is out of fine-tuning range and provides the appropriate frequency adjustment. The lock detector and the monotonicity check circuit determine when lock has occurred and provide the appropriate VCO frequency adjustment using the VCO's coarse control voltage so that the VCO's fine control voltage is approximately at zero volts (i.e., the VCO's fine-tuning frequency range is centered approximately around a target frequency). Physical trimming is thus eliminated by use of the on-chip trimming circuitry that adjusts the VCO frequency when it is out of range by executing adjustments based on the signals received from the VCO frequency range detector.

In accordance with one embodiment of the present invention, a voltage-controlled oscillator frequency calibration system includes a phase-locked loop circuit having a voltage-controlled oscillator, a frequency range detector, a counter, and a digital-to-analog converter. The frequency range detector determines when a target frequency is out of fine-tuning frequency range and provides a first output signal to tune the voltage-controlled oscillator. The counter counts up or down based on a value of the first output signal from the frequency range detector and provides a counter output signal. The digital-to-analog converter receives the counter output signal and adjusts a coarse-tuning control of the voltage-controlled oscillator based on a value of the counter output signal.

The system may further comprise a lock detector that provides a first output signal indicating if the phase-locked loop circuit is locked. A shift register provides a plurality of clock pulses when the first output signal from the lock detector is asserted. A monotonicity check circuit receives at least a first clock pulse from the plurality of clock pulses from the shift register and provides a first output signal to the counter to count up or down to adjust the coarse tuning control of the voltage-controlled oscillator to approximately center the fine-tuning frequency range of the phase-locked loop circuit around the target frequency.

In accordance with another embodiment of the present invention, a method of calibrating a phase-locked loop circuit includes monitoring the phase-locked loop circuit to determine if a target frequency is within a fine-tuning frequency range; adjusting a coarse tuning of the phase-locked loop circuit if the target frequency is outside of the fine-tuning frequency range; monitoring the phase-locked loop circuit to determine if the fine-tuning frequency range is centered around the target frequency; and adjusting the coarse tuning of the phase-locked loop circuit if the fine-tuning frequency range is not centered approximately around the target frequency.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
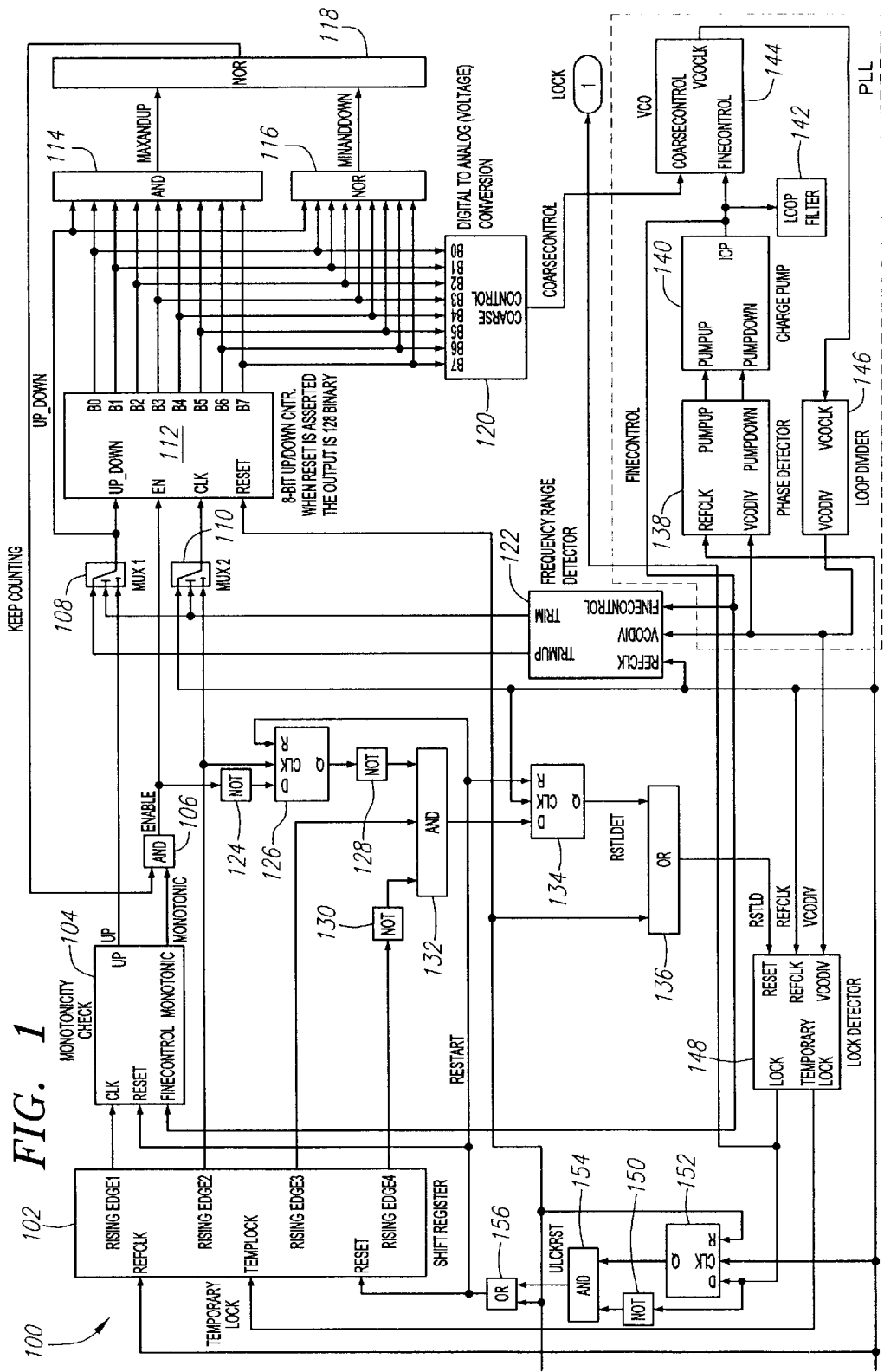
FIG. 1 shows a block diagram illustrating a voltage-controlled oscillator frequency auto-calibrating system in accordance with an embodiment of the present invention.

FIG. 1 shows a block diagram illustrating a VCO frequency auto-calibrating system 100 in accordance with an embodiment of the present invention. VCO frequency auto-calibrating system 100 includes a shift register 102, a monotonicity check 104, logic gates 106, 114, 116, 118, 124, 128, 130, 132, 136, 150, 154, and 156, multiplexers (mux 1 and mux 2) 108 and 110, a counter 112, a digital-to-analog (D/A) converter 120, a frequency range detector 122, flip-flops 126, 134, and 152, a phase detector 138, a charge pump 140, a loop filter 142, a VCO 144, a loop divider 146, and a lock detector 148.

VCO frequency auto-calibrating system 100 receives a power-on reset signal and a reference clock (refclk) signal and provides, as an output signal, a lock signal. Lock signal is the output signal provided by lock detector 148 of VCO frequency auto-calibrating system 100 to indicate when the phase-locked loop is locked.

Power-on reset signal provides a signal pulse during the initial application of power. Power-on reset signal is received by counter 112 at its reset terminal and, when power-on reset signal is asserted, results in counter 112 setting its output value to 128 binary. Power-on reset signal also initializes shift register 102 and flip-flops 126 and 134, through logic gate 156 (an OR gate), and initializes lock detector 148, through logic gate 136 (an OR gate), and flip-flop 152.

Logic gate 156 provides a restart (restart) signal, which is pulsed when power-on reset signal is asserted (e.g., pulsed) or when lock signal from an output (lock) terminal of lock detector 148 transitions from a logical high to a logical low (i.e., the phase-locked loop has lost lock). Flip-flop 152 and logic gate 150 (a NOT gate) receive lock signal and provide an output to logic gate 154 (an AND gate), which provides an output signal (uLckRst) to logic gate 156. Output signal (uLckRst) is asserted when lock signal transitions from a logical high to a logical low and, thus, logic gate 156 provides a logical true output for one reference clock (refClk) signal period when this occurs.

Restart (restart) signal resets shift register 102, monotonicity check 104, and flip-flops 126 and 134. Restart (restart) signal performs a function similar to that of power-on reset signal, by resetting various circuitry in preparation for performing or re-starting the calibration process, but restart (restart) signal does not reset counter 112, because its current value is probably closer to the desired value than its reset value. An important function of restart (reStart) signal is to release monotonicity check 104 and allow its clock to operate (the clock is frozen when monotonicity check 104 determines that calibration is complete, i.e., when an output (monotonic) signal transitions to a logical false value, as explained in further detail herein).

Reference clock (refclk) signal provides a stable clock signal used by shift register 102, flip-flops 134 and 152, lock detector 148, frequency range detector 122, phase detector 138, and counter 112 (when multiplexer 110 is switched appropriately, described in further detail herein). Reference clock (refclk) signal, for example, is a frequency synthesizer reference clock.

Shift register 102 has four flip-flops that generate four rising-edge pulses when a temporary lock signal is asserted at its input (tempLock) terminal. The four rising-edge pulses are each one reference clock (refClk) signal period apart and are sequentially provided on the four output terminals (risingEdge1, risingEdge2, risingEdge3, risingEdge4) of shift register 102. For example, every time temporary lock signal is asserted (e.g., transitions to a logical high), a rising-edge pulse occurs on a first output terminal (risingEdge1), followed one reference clock (refClk) period later by a rising-edge pulse at a second output terminal (risingEdge2), followed one reference clock (refClk) period later by a rising-edge pulse at a third output terminal (risingEdge3), and finally followed one reference clock (refClk) period later by a rising-edge pulse at a fourth output terminal (risingEdge4).

Monotonicity check 104 receives the rising-edge pulse, from first output terminal (risingEdge1) of shift register 102, at its clock (Clk) terminal, restart (restart) signal at its reset terminal, and a fine control signal at its fine control terminal. Fine control signal is the fine control voltage of VCO 144. Monotonicity check 104 provides two output signals, an output (up) signal and an output (monotonic) signal from its corresponding output (up) terminal and output (monotonic) terminal.

Output (monotonic) signal indicates whether calibration should continue (i.e., a logical high signal value) or whether calibration has been completed (i.e., a logical low signal value). Output (up) signal indicates the polarity of fine control signal and indicates the desired direction of coarse control adjustment for VCO 144.

Figure 2:
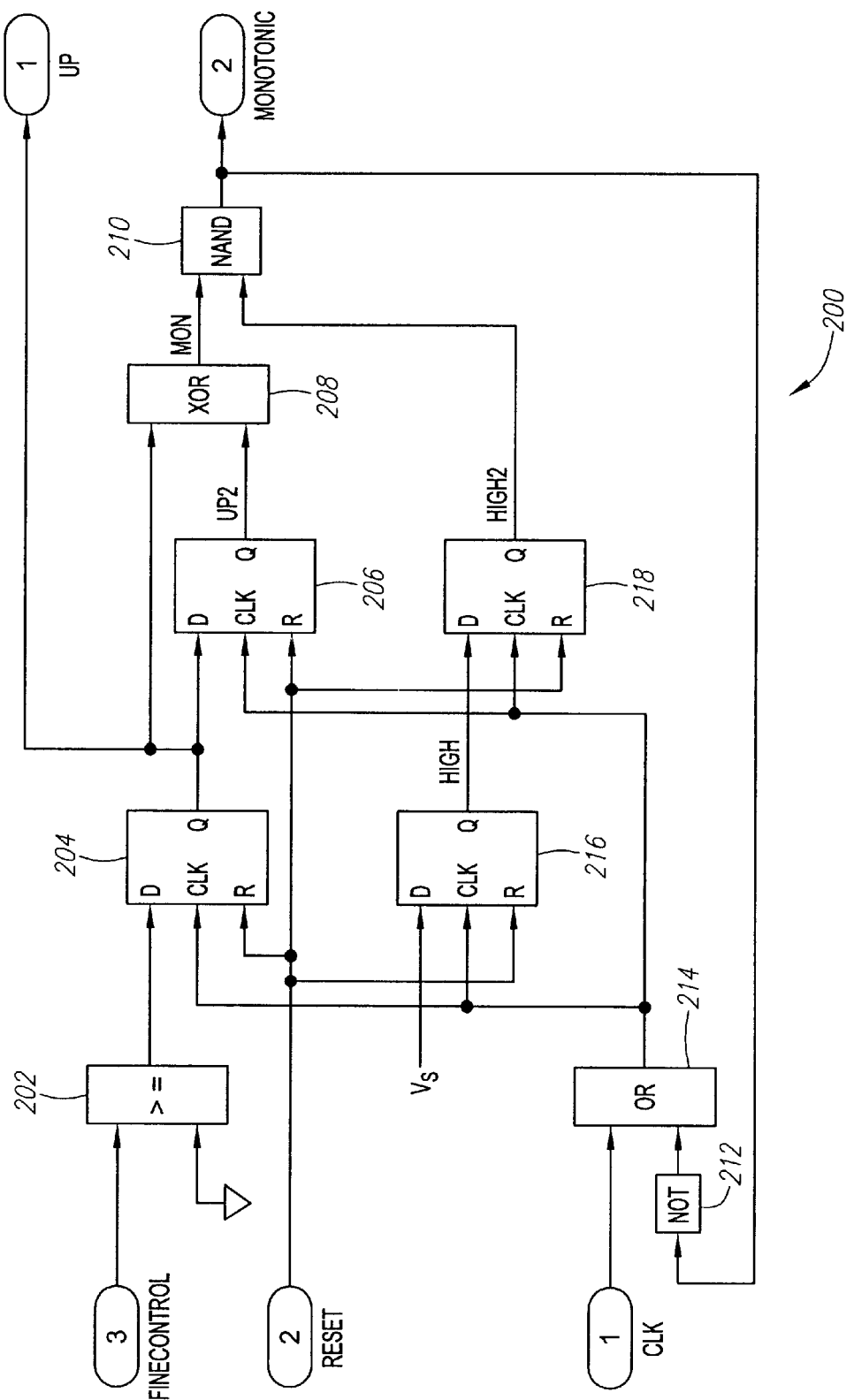
FIG. 2 shows a more detailed view of a portion of the block diagram for the embodiment of FIG. 1.

Referring briefly to FIG. 2, a monotonicity check circuit 200 is shown, which is an exemplary circuit for monotonicity check 104. Monotonicity check circuit 200 includes a comparator 202, flip-flops 204, 206, 216, and 218, and logic gates 208, 210, 212, and 214.

For monotonicity check circuit 200, after restart (restart) signal is received at reset terminal of monotonicity check circuit 200, flip-flops 216 and 218 force output (monotonic) signal to be a logical true from the first rising-edge clock pulse received at its clock (clk) terminal to the second rising-edge clock pulse. Output (high2) signal from a Q output terminal of flip-flop 218, being a logical false value, forces output (monotonic) signal to be a logical true value until two samples (current and previous) of fine control signal can be obtained. After two clock pulses are received by flip-flops 214 and 216, output (high2) signal will be a logical true value due to a logical high signal value (represented by Vs in FIG. 2) provided at a D input terminal of flip-flop 214.

On the first rising-edge clock pulse received at clock (clk) terminal, flip-flop 204, which provides output (up) signal from its Q terminal, loads the current status of fine control signal, whose value is first compared by comparator 202 that acts as a zero-crossing comparator. At the second rising-edge clock pulse received at clock (clk) terminal, flip-flop 204 loads the present polarity of fine control signal while flip-by flop 206, which provides an output (up2) signal from its Q terminal, loads the previous polarity of fine control signal (provided by output (up) signal from Q terminal of flip-flop 204).

Logic gate 208 (an exclusive OR gate) receives output (up) signal from flip-flop 204 and output (up2) signal from flip-flop 206 and provides an output (mon) signal. If the present and previous polarity of fine control signal are the same, output (mon) signal is a logical low and output (monotonic) signal from logic gate 210 (a NAND gate) remains a logical high. Once output (mon) signal becomes a logical high (present and previous polarity of fine control signal values differ), then logic gate 210 provides a logical low signal for output (monotonic) signal, which indicates the completion of the calibration process. Once output (monotonic) signal from logic gate 210 transitions to a logical low, the clock signal for flip-flops 204, 206, 216, and 218 is forced to a logical high by logic gate 214 (an OR gate) and logic gate 212 (a NOT gate), regardless of the signal value received at clock (clk) input terminal of monotonicity check circuit 200.

Output (mon) signal is not the final indication of monotonicity, because output (up2) signal from flip-flop 206 is initially set to zero (due to receipt of restart (restart) signal) at the first rising-edge pulse received at clock (clk) terminal. Thus, if fine control signal was larger than zero (i.e., comparator 202 providing a logical true signal), then output (mon) signal from logic gate 208 would be a logical true despite the fact that the calibration process has not been responsible for the change of polarity in fine control signal. Rather, a transient due to the initial condition of flip-flop 206 would have been responsible.

Returning to FIG. 1, counter 112 is an 8-bit up/down counter that provides output signals through output terminals B0–B7, which are coupled to corresponding input terminals B0–B7 of D/A converter 120, and to input terminals of logic gate 114 (an AND gate) and to logic gate 116 (a NOR gate). Counter 112 has an input (up_down) terminal, an enable (en) input terminal, a clock (clk) input terminal, and reset terminal (described above as receiving power-on reset signal).

Input (up_down) terminal receives either output (up) signal from monotonicity check 104 or an output (trimup) signal from frequency range detector 122, depending upon the setting of multiplexer (mux 1) 108. Clock (clk) input terminal of counter 112 receives reference clock (refClk) signal or a clock signal from second output terminal (risingEdge2) of shift register 102, depending upon the setting of multiplexer (mux 2) 110.

An output (trim) signal from frequency range detector 122 determines the signals multiplexers 108 and 110 will select. If output (trim) signal is a logical true, then output (trimup) signal will be selected by multiplexer 108 and reference clock (refclk) signal will be selected by multiplexer 110 and be received by input (up_down) terminal and clock (clk) terminal, respectively, of counter 112. If output (trim) signal is a logical false, then output (up) signal will be selected by multiplexer 108 and the clock signal from second output terminal (risingEdge2) will be selected by multiplexer 110 and be received by input (up_down) terminal and clock (clk) terminal, respectively, of counter 112.

Enable (en) input terminal of counter 112 receives an enable signal from logic gate 106 (an AND gate), which receives output (monotonic) signal from monotonicity check 104 and a keep counting signal from logic gate 118 (a NOR gate). Enable signal when asserted permits counter 112 to count up or down 1 LSB, depending upon the signal value (i.e., a logical true or a logical false, respectively) received at input (up_down) terminal.

Keep counting signal provided by logic gate 118 is at a logical false value if logic gate 114 indicates that counter 112 has reached its maximum value (i.e., a logical true signal value from each output terminal B0 through B7 of counter 112) and the. signal value at input (up_down) terminal is also a logical true value. Keep counting signal is also a logical false value if lid logic gate 116 indicates that counter 112 has reached its minimum value (i.e., a logical false signal value from each output terminal B0 through B7 of counter 112) and the signal value at input (up_down) terminal is also a logical false value. If keep counting signal is a logical false value, then counter 112 is prevented from changing its output value because enable signal from logic gate 106 is a logical false value and the calibration process is stopped.

Digital-to-analog (D/A) converter 120 receives at its input terminal B0–B7 signal values from corresponding output terminal B0–B7 of counter 112. For example, the resolution of D/A converter 120 is 4.7 mV and a 128 binary output of counter 112 results in a 4.7 mV (1 LSB) output of D/A converter 120. With the 8-bit control input of D/A converter 120, the output range is from –596.9 mV (i.e., input to D/A converter 120 is zero binary) to 601.6 mV (i.e., input to D/A converter 120 is 255 binary).

D/A converter 120 provides a coarse control signal from its coarse control terminal to VCO 144 to provide coarse tuning of VCO 144. As an example, the ratio of coarse control frequency gain to fine control frequency gain can be set to approximately 4, resulting in 18.8 mV of fine control adjustment for every 4.7 mV of coarse control. Thus, the accuracy of the calibration will be approximately 4.7 mV (1 LSB) for coarse control signal, translating into 18.8 mV of fine control signal, and consequently, the final value of fine control signal upon completion of calibration will be within +18.8 mV to –18.8 mV.

Phase detector 138, charge pump 140, loop filter 142, VCO 144, and loop divider 146 form a phase-locked loop (PLL) ENS circuit. VCO 144 receives coarse control signal from D/A converter 120 and fine control signal from charge pump 140 and provides a VCO clock signal from its output (vcoClk) terminal. Loop divider 146 receives VCO clock signal and provides a clock (vcoDiv) signal at its output (vcoDiv) terminal. Clock (vcoDiv) signal from loop divider 146 is at a reduced or divided clock rate than VCO clock signal and is received by phase detector 138, frequency range detector 122, and lock detector 148, at their corresponding input (vcoDiv) terminal.

Phase detector 138 receives reference clock (refClk) signal and clock (vcoDiv) signal (from loop divider 146), determines the phase or frequency difference, and provides an appropriate signal at its output terminals (labeled pumpup and pumpDown) to corresponding input terminals on Charge pump 140. Charge pump 140 acts upon loop filter 142 to provide fine control signal to VCO 144, frequency range detector 122, and monotonicity check 104.

Frequency range detector 122 functions to keep fine control signal within its allowed range. When fine control signal exceeds its allowed range, frequency range detector 122 adjusts the value of coarse control signal provided by D/A converter 120. This is accomplished by forcing counter 112 to count in the appropriate direction to adjust the PLL so that fine control signal moves to within its appropriate range of values.

Frequency range detector 122 receives reference clock (refClk) signal at its reference clock (refClk) input terminal, clock (vcoDiv) signal from loop divider 146 at its clock (vcoDiv) input terminal, and fine control signal at its fine control input terminal. Frequency range detector 122 provides a trim signal from its output (trim) terminal and a frequency adjustment direction (trimup) signal from its output (trimup) terminal.

Trim signal indicates whether a VCO frequency adjustment is required, with a logical true indicating that a frequency adjustment is required and a logical false indicating that no frequency adjustment is required. Frequency adjustment direction (trimup) signal indicates whether the VCO frequency has to be increased (i.e., a logical true) or decreased (i.e., a logical false).

Trim signal controls multiplexers 108 and 110, with a logical true value of trim signal resulting in frequency adjustment direction (trimup) signal from frequency range detector 122 and reference clock (refClk) signal passing through multiplexers 108 and 110, respectively. If trim signal has a logical false value, then multiplexers 108 and 110 select output (up) signal from monotonicity check 104 and a clock signal from second output terminal (risingEdge2) of shift register 102, respectively.

An example of a frequency range detector, such as frequency range detector circuit 122 shown in FIG. 1, can be found in U.S. patent application Ser. No. 09/951,302 entitled "Voltage-Controlled Oscillator Frequency Range Detector", filed Sep. 10, 2001, which is incorporated herein by reference in its entirety.

Lock detector 148 receives clock (vcoDiv) signal from loop divider 146 at its input (vcoDiv) terminal, reference clock (refClk) signal at its input (refclk) terminal, and a reset (rstLD) signal at its input (reset) terminal. Lock detector 148 provides lock signal from its output (lock) terminal and temporary lock signal from its output (temporary lock) terminal.

Reset (rstLD) signal is received from logic gate 136 (an OR gate), which receives power-on reset signal and an output (rstLDet) signal from a Q output terminal of flip-flop 134. Output (rstLDet) signal resets the lock detector (i.e., forcing temporary lock signal to a logical false) every time an VD adjustment is made to VCO 144 through coarse control signal (i.e., enable signal from logic gate 106 is at a logical true allowing counter 112 to count up or down). Consequently, when enable signal is at a logical true and a clock pulse is received from third output terminal (risingEdge3) of shift register 102, logic gate 132 provides a logical true signal to a D input terminal of flip-flop 134 until logic gate 132 receives a clock pulse from fourth output terminal (risingEdge4) of shift register 102. This results in lock detector 148 being reset.

Temporary lock signal of lock detector 148 is set to a logical true value when the PLL is locked. Temporary lock signal is reset every time a VCO frequency adjustment (i.e., enable signal is a logical true) is performed by VCO frequency auto-calibrating system 100. Lock signal will only transition to a logical true value if temporary lock signal has not been reset for a number of reference clock (refClk) signal periods (i.e., indicating the completion of the VCO calibration process). For example, a counter within lock detector 148 monitors temporary lock signal and reference clock (refClk) signal and indicates when temporary lock signal has remained at a logical true value for 256 reference clock (refClk) signal periods.

After the PLL has been locked for a period of time and then becomes unlocked, lock signal (and temporary lock signal) will transition from a logical true value to a logical false value and the VCO calibration process will resume from its latest calibration position. Consequently, counter 112 is not reset as when power-on reset signal is asserted, because counter 112 is probably closer to the desired value than would its default value.

Lock signal only plays a role in the calibration process when it transitions from a logical true to a logical false value. Generally, temporary lock signal is the only signal affecting the VCO calibration process, while lock signal remains at a logical false during the calibration process. Temporary lock signal is a true indication of lock for the PLL, but is not used as the final indication. For example, when temporary lock signal transitions to a logical true value, coarse control signal may be adjusted, which adjusts the VCO frequency of VCO 144 and potentially causes the PLL to become unlocked. Thus, lock signal is used as the final indication of PLL lock and the completion of calibration for VCO frequency auto-calibrating system 100.

In terms of general circuit operation for VCO frequency auto-calibrating system 100, frequency range detector 122 monitors the PLL and utilizes counter 112 and D/A converter 120 to adjust VCO 144 so that the target frequency can be acquired using fine control signal. Lock detector 148., along with shift register 102 and monotonicity check 104, utilize counter 112 and D/A converter 120 to adjust coarse control of VCO 144 to approximately center the VCO frequency range corresponding to fine control signal around the target frequency. This is determined by monotonicity check 104 that monitors the polarity of fine control signal and stops the calibration process once the polarity of fine control signal changes (i.e., polarity change from positive to negative or negative to positive). This indicates that fine control signal is approximately at zero volts, which is the center of the frequency range corresponding to fine control signal. Alternatively, if a different voltage level (other than zero volts) is chosen as the midpoint range of fine control signal, comparator 202 of FIG. 2 can compare fine control signal to a corresponding reference voltage (rather than to ground or zero volts).

More specifically, when the PLL acquires the target frequency and achieves lock, temporary lock signal from lock detector 148 becomes a logical true signal value. Shift register 102, upon receipt of the asserted temporary lock signal, produces four rising-edge pulses.

Monotonicity check 104 receives a rising-edge pulse from first output terminal (risingEdge1), which allows monotonicity check 104 (after receipt of at least two rising-edge pulses after a reset so that the history of the status of fine control signal can be obtained) to indicate whether the previous and present value of fine control signal have the same polarity. Note that after a reset, the first rising-edge pulse from first output terminal (risingEdge1) always triggers a calibration adjustment (i.e., a trimming event) of the frequency of VCO 144 regardless of the polarity of fine control signal.

If the polarity values are the same, monotonicity check 104 provides a logical true value for output (monotonic) signal. Logic gate 106 then provides a logical true value for enable signal, which allows counter 112 to count up or down one LSB to adjust the frequency of VCO 144, as described above.

For example, once PLL is locked (i.e., temporary lock signal is a logical true value), monotonicity check 104 monitors fine control signal and adjusts coarse control of VCO 144 using coarse control signal to adjust the frequency of VCO 144 to center the VCO frequency range corresponding to fine control signal around the target frequency. Once fine control signal changes polarity, the approximate center of the range of fine control signal has been found (e.g., within 1 LSB) and the calibration process is stopped. Monotonicity check 104 then provides a logical false value for output (monotonic) signal, resulting in enable signal being a logical false value and counter 112 being prevented from changing its output value.

The rising-edge clock pulse from second output terminal (risingEdge2) from shift register 102, which occurs one reference clock (refClk) signal period after the rising-edge clock pulse from first output terminal (risingEdge1), is the clock of counter 112 (when trim signal from frequency range detector 122 is a logical false value). The rising-edge clock pulse from second output terminal (risingEdge2) causes counter 112 to count up or down 1 LSB depending upon whether the signal value at its input (up-down) terminal is at a logical true value or logical false value, respectively.

The rising-edge clock pulse from second output terminal (risingEdge2) is also used by flip-flop 126 to sample enable signal. If enable signal is at a logical true signal value, then logic gate 132 produces a signal pulse that starts upon receipt of the clock pulse from third output terminal (risingEdge3) of shift register 102 and ends upon receipt of the clock pulse from fourth output terminal (risingEdge4). The signal pulse from logic gate 132 will reset lock detector 148, which forces temporary lock signal to a logical false value, because an adjustment to coarse control of VCO 144 occurred due to counter 112 changing by one LSB.

Once the PLL locks again, temporary lock signal from lock detector 148 will return to a logical true value and the process repeats until monotonicity check 104 forces enable signal to a logical false value. Temporary lock signal will then remain at a logical true value and lock signal will become a logical true value, after a set period of time, indicating that the PLL is locked.

If for any reason the PLL becomes unlocked, lock signal (and temporary lock signal) will transition to a logical false value, resulting in the assertion of restart (restart) signal, which releases the internal clock of monotonicity check 104 and restarts the calibration process. As described above, when the calibration process restarts, counter 112 is not reset because its previously calibrated value is probably closer than the default value to the new calibrated value to be determined.

The VCO frequency calibration system disclosed herein performs center-frequency self-calibration of its VCO by use of a VCO frequency range detector, monotonicity check circuitry, and a lock detector. Physical trimming is thus eliminated by use of the on-chip trimming circuitry that adjusts the VCO center frequency based on its monitoring of the fine control voltage of the VCO.

Embodiments described above illustrate but do not limit the invention. It should also be understood that numerous modifications and variations are possible in accordance with the principles of the present invention. Accordingly, the scope of the invention is defined only by the following claims.

I claim:

1. A voltage-controlled oscillator frequency calibration system, comprising:
    a phase-locked loop circuit having a voltage-controlled oscillator;
    a frequency range detector coupled to the phase-locked loop circuit, the frequency range detector determining when a target frequency is out of fine tuning frequency range and providing a first output signal to tune the voltage-controlled oscillator;
    a counter coupled to the frequency range detector and receiving the first output signal from the frequency range detector, the counter counting up or down based on a value of the first output signal from the frequency range detector and providing a counter output signal; and
    a digital-to-analog converter coupled to the counter and to the phase-locked loop circuit, the digital-to-analog converter receiving the counter output signal and adjusting a coarse tuning control of the voltage-controlled oscillator based on a value of the counter output signal.

2. The system of claim 1, wherein the phase-locked loop further comprises a phase detector, a charge pump, a loop filter, and a loop divider.

3. The system of claim 1, wherein the frequency range detector further provides a second output signal indicating that the voltage-controlled oscillator requires coarse tuning control adjustment.

4. The system of claim 1, further comprising:
    a lock detector coupled to the phase-locked loop circuit, the lock detector providing a first output signal indicating if the phase-locked loop circuit is locked;
    a shift register, coupled to the lock detector, providing a plurality of clock pulses when the first output signal from the lock detector is asserted; and
    a monotonicity check circuit coupled to the phase-locked loop circuit, to the shift register, and to the counter, the monotonicity check circuit receiving at least a first clock pulse from the plurality of clock pulses from the shift register and providing a first output signal to the counter to count up or down to adjust the coarse tuning control of the voltage-controlled oscillator to approximately center the fine tuning frequency range of the phase-locked loop circuit around the target frequency.

5. The system of claim 4, wherein the lock detector further provides a second output signal indicating if the phase-locked loop circuit has remained locked for a certain time period.

6. The system of claim 4, wherein the monotonicity check circuit provides a second output signal to the counter to enable the counter to change its output.

7. The system of claim 4, further comprising:
    a first multiplexer coupled to the frequency range detector and to the monotonicity check circuit, the first multiplexer selecting either the first output signal from the frequency range detector or the first output signal from the monotonicity check circuit to allow through to the counter based on a value of a second output signal of the frequency range detector; and
    a second multiplexer coupled to the frequency range detector and to the monotonicity check circuit, the second multiplexer selecting either a reference clock signal or a clock pulse from the plurality of clock pulses from the shift register to allow through to the counter based on a value of the second output signal of the frequency range detector.

8. The system of claim 6, further comprising a reset circuit coupled to the shift register, the monotonicity check circuit, and to the lock detector, the reset circuit receiving several of the plurality of clock pulses from the shift register and resetting the lock detector based on a value of the second output signal from the monotonicity check circuit.

9. The system of claim 8, further comprising a restart circuit that resets the shift register and the monotonicity check circuit and reinitiates calibration of the phase-locked loop circuit after the phase-locked loop circuit loses lock.

10. A voltage-controlled oscillator frequency calibration system, comprising:
    a phase-locked loop circuit;
    means for monitoring the phase-locked loop circuit and adjusting a coarse tuning frequency control of the phase-locked loop circuit to achieve frequency lock;
    means for monitoring the phase-locked loop circuit and adjusting the coarse tuning frequency control of the phase-locked loop circuit to approximately center a fine tuning frequency control range around a target frequency; and
    means for resetting a lock detection signal during the adjusting of the coarse tuning frequency control.

11. A method of calibrating a phase-locked loop circuit, the method comprising:
    monitoring the phase-locked loop circuit to determine if a target frequency is within a fine-tuning frequency range;
    adjusting a coarse tuning of the phase-locked loop circuit if the target frequency is outside of the fine-tuning frequency range;
    monitoring the phase-locked loop circuit to determine if the fine-tuning frequency range is centered around the target frequency;
    adjusting the coarse tuning of the phase-locked loop circuit if the fine-tuning frequency range is not centered approximately around the target frequency; and resetting a lock detection indication after every adjustment to the coarse tuning of the phase-locked loop circuit.

12. The method of claim 11, wherein the adjusting of the coarse tuning to center approximately the fine-tuning frequency range around the target frequency is performed based on whether a fine-tuning control signal changes polarity after an adjustment to the coarse tuning of the phase-locked loop circuit.

13. The system of claim 10, wherein the means for monitoring to achieve if frequency lock comprises:

a frequency range detector, coupled to the phase-locked loop circuit, adapted to provide a first output signal to tune the phase-locked loop circuit when a target frequency is out of fine tuning frequency range;

a counter, coupled to the frequency range detector, adapted to receive the first output signal and provide a counter output signal; and a digital-to-analog converter, coupled to the counter and to the phase-locked loop circuit, adapted to receive the counter output signal and adjust the coarse tuning frequency control based on the counter output signal.

14. The system of claim 13, wherein the frequency range detector further provides a second output signal indicating that the phase-locked loop circuit requires tuning of the coarse tuning frequency control.

15. The system of claim 10, wherein the means for monitoring to approximately center the fine tuning frequency control range around the target frequency comprises:

a lock detector, coupled to the phase-locked loop circuit, adapted to provide the lock detection signal indicating if the phase-locked loop circuit is locked;

a shift register, coupled to the lock detector, adapted to provide at least one clock pulse when the lock detection signal is asserted; and a monotonicity check circuit, coupled to the phase-locked loop circuit and the shift register, adapted to provide a monotonicity signal for adjusting the coarse tuning frequency control to approximately center the fine tuning frequency control range around the target frequency.

16. The system of claim 15, wherein the means for monitoring to approximately center the fine tuning frequency control range around the target frequency further comprises:

a counter, coupled to the monotonicity check circuit and to the phase-locked loop circuit, adapted to receive the monotonicity signal and provide a counter signal; and a digital-to-analog converter, coupled to the counter and to the phase-locked loop circuit, adapted to receive the counter signal and adjust the coarse tuning frequency control based on the counter output signal.

17. The system of claim 16, wherein the lock detector further provides a lock signal indicating if the phase-locked loop circuit has remained locked for a certain duration.

18. The system of claim 15, wherein the means for resetting the lock detection signal comprises a reset circuit, coupled to the shift register, the monotonicity check circuit, and to the lock detector, adapted to reset the lock detector based on the monotonicity signal.

* * * * *